United States Patent [19]

Hein et al.

[11] 4,248,960

[45] Feb. 3, 1981

[54] RADIATION RESPONSIVE RELIEF IMAGEABLE PLASTIC LAMINATE

[75] Inventors: Paul R. Hein; Michael W. Yang; Robert A. Irvin; Steven E. Bauer, all of Marietta; Roland L. Orem, Douglasville, all of Ga.

[73] Assignee: W. R. Grace & Co., Cambridge, Mass.

[21] Appl. No.: 871,748

[22] Filed: Jan. 23, 1978

[51] Int. Cl.$^2$ .............................................. G03F 7/02
[52] U.S. Cl. .................................. 430/306; 430/286; 430/325; 430/502
[58] Field of Search ............... 96/36.3, 33, 35.1, 86 P; 260/46.5 R; 430/286, 306, 325, 502

[56] References Cited

U.S. PATENT DOCUMENTS

| | | | |
|---|---|---|---|
| 3,240,844 | 3/1966 | Gruver | 260/894 |
| 3,265,765 | 8/1966 | Holden et al. | 260/28.5 B X |
| 3,627,529 | 12/1971 | Frank et al. | 96/86 P X |
| 3,674,486 | 7/1972 | Milgrom | 96/35.1 |
| 3,843,502 | 10/1974 | Pearson et al. | 204/159.18 |
| 3,864,229 | 2/1975 | Zapp et al. | 204/159.15 |
| 4,045,231 | 8/1977 | Toda et al. | 96/115 P |

*Primary Examiner*—Edward C. Kimlin
*Attorney, Agent, or Firm*—Edward J. Hanson, Jr.; C. E. Parker

[57] ABSTRACT

A relief producing laminate having an over-lamina comprised of an unsaturated natural-like rubber composition characterized by relief differentiation in response to patterned radiation exposure and an under-lamina comprised of a resilient composition and adhered to the over-lamina. The term "natural-like rubber" as used herein includes both natural and synthetic rubbers which exhibit creep as a result of stress relaxation after being cast or formed.

The over-lamina is preferably a butadiene homopolymer or copolymer resin composition, more preferably a halogenated butadiene composition and most preferably a neoprene composition. The composition preferably includes a thiol, a monomer and a photoinitiator.

The under-lamina composition may be a woven textile or a polymer and is preferably a monoalkenyl aromatic-diene block copolymer resin composition. It is preferably radiation cured and preferably includes a monomer and a photoinitiator.

The under-lamina preferably comprises at least three juxtaposed layers, each layer being less highly cured than the juxtaposed under-layer and the over-lamina preferably comprises at least three juxtaposed layers with at least the layer closest to the under-lamina being more highly cured than the over-layers.

The invention also includes the stabilized plastic printing plate produced from the laminate and the method of radiation curing the laminate to produce the printing plate.

14 Claims, No Drawings

RADIATION RESPONSIVE RELIEF IMAGEABLE PLASTIC LAMINATE

This application is related to application U.S. Ser. No. 871,949 entitled "Radiation Curing Halogen Substituted Butadiene" filed on the same date, and assigned to the same assignee.

BACKGROUND OF THE INVENTION

This invention relates to a curable composition and especially to those that can have controlled cure through the use of appropriate curing agents. In its most preferred and presently useful form the invention provides relief printing plates which are characterized by unusually good dimensional stability coupled with improved solvent resistance and non-tacky surfaces while retaining the many desirable properties espoused for other plates and often with enhanced quality.

The preferred relief layer composition is preferably provided with a preferred under-lamina that will stabilize the finished printing plate against creep, physical deformation and stress relaxation in the polymer structure.

The preferred over-lamina gives excellent use with a wide variety of ink formulations. Fortunately the expansion, contraction and other distortion properties of the over-lamina and the under-lamina are compatible for long press runs without failures. This is particularly true with the preferred compositions and layered constructions.

Many patents independently reveal various features of the inventive structure and its preferred inventive embodiments. They however lack the overall advantage presented by the synergistic effectiveness of the present new compositions, methods and structures. U.S. Pat. No. 3,024,180 discloses a photopolymerizable composition having at least 40% by weight of solvent-soluble elastomeric homopolymer of poly (chloro-2-butadiene-1,3) and at least 10% by weight of addition polymerizable ethylenically unsaturated compound containing 1 to 2 terminal ethylenic groups plus an initiator. U.S. Pat. No. 3,674,486 and British Pat. No. 1,366,769 disclose compositions having an A-B-A type block copolymer. Similar A-B block copolymer compositions are disclosed in German Patent Publications DT OS Nos. 24 56 439 and DT OS 26 10 206. French Patent Publication No. 2,103,825 reveals acrylonitrile-butadiene copolymer compositions also containing an acrylate monomer.

There are a number of U.S. and foreign patents that show photocurable compositions that have as a major chemically functioning constituent a polythiol. This is unlike the present invention where the polythiol constituent seemingly acts in some way to regulate and make more effective the polymerization of the constituent components of the composition. Examples of patents that show photocurable compositions that have a polythiol as a major chemically functioning constituent are U.S. Pat. Nos. 4,008,341; 3,843,572; 3,832,421; 3,783,152; 3,666,461; 3,661,744; 3,627,529 and 3,615,450 and Canadian Pat. Nos. 930,094; 926,183; 924,047 and 885,388.

SUMMARY OF THE INVENTION

The relief producing structure of the present invention is a laminate having at least two lamina, an over-lamina comprised of an unsaturated natural-like rubber composition characterized by relief (depth) differentiation in response to patterned radiation exposure and an under-lamina comprised of a resilient composition that is not a natural-like rubber and adhered to said over-lamina. The under-lamina composition is preferably chosen from the group consisting of compositions comprising a woven textile and a polymer. The polymer is preferably chosen from the group consisting of compositions comprising radiation polymerizable material and radiation polymerized material. The preferred polymer composition comprises at least 40% by composition weight of a block copolymer resin having the general formula A-B-A with blocks A being monoalkenyl aromatic blocks and with block B being derived from conjugated diene hydrocarbon. Preferably the under-lamina is photocurable and contains from about 0.01 to about 10% by resin weight of photoinitiator and also at least one monomer substantially compatible with the resin and having at least on radiation cross-linkable C—C double bond.

The over-lamina composition preferably consist of a composition comprising about 10 to about 97% by composition weight of a C—C unsaturated polymeric resin and at least about 1% by resin weight of at least one monomer having at least one radiation cross-linkable C—C unsaturated bond. Preferably the over-lamina composition is chosen from the group consisting of compositions comprising butadiene homopolymer and copolymer resins. More preferably compositions comprising halogen substituted butadiene resin are chosen. Preferably the halogen substituted butadiene is chosen from the group consisting of 2-chloro-1,3-butadiene; 2-fluoro-1; 3-butadiene and 2,3-dichloro-1, 3-butadiene and mixtures thereof and is present in an amount of at least about 80% by weight of the composition. Preferably the monomer is present in an amount of about 1 to about 10% by resin weight. More preferably about 5 to about 10% by resin weight. Preferably the over-lamina composition includes about 0.01 to about 10% by resin weight of photoinitiator and about 0.1 to about 35% by weight of thiol, preferably a polythiol.

In the preferred lamina structure the under-lamina comprises at least three juxtaposed layers, each layer being less highly cured than the juxtaposed under-layer and the over-lamina comprises at least three juxtaposed layers with at least the layer closest to the under-lamina being more highly cured than the over-layers of the over-lamina. Whether the over-lamina is a single layer or two or more layers it is preferably no thicker than about 85 mils; more preferably it has a thickness between about 1 to about 50 mils and most preferably it has a thickness between 30-40 mils.

Also provided is a stabilized plastic printing plate comprising a relief imaged surface in the over-lamina comprised of natural-like rubber, a resilient stabilizing creep resistant under-lamina more resistant to distortion than the over-lamina during printing operations and adhered to the over-lamina, and a carrier-lamina more resistant to distortion than the under-lamina adhered to the under-lamina opposite the over-lamina.

Further, a method of radiation curing the laminate to produce the printing plate is provided.

BEST MODE

The present invention in its preferred embodiment is a relief producing laminate structure, method for forming a printing plate and stabilized plastic printing plate having an over-lamina comprised of unsaturated synthetic natural-like rubber composition and an under-lamina comprised of a resilient material that is not a natural-like rubber. The over-lamina composition preferably consists of a composition chosen from the group consisting of compositions comprising butadiene homopolymer and copolymer resins and mixtures thereof. The under-lamina is preferably chosen from the group consisting of compositions comprising woven textiles and polymers.

OVER-LAMINA COMPOSITION DISCUSSION

The over-lamina preferably contains about 0.1 to about 35% more preferably about 0.5 to about 10%, by resin weight of thiol. Preferably the thiol is a polythiol present in the preferred amounts. In its preferred form the over-lamina is curable by actinic radiation and contains about 0.01 to about 10%, more preferably about 0.2 to about 5% by resin weight of photoinitiator.

The over-lamina unsaturated natural-like rubber composition is preferably comprised of a halogen substituted butadiene, even more preferably one chosen from the group consisting of the 1,3-butadiene type, preferably 2-chloro-1,3-butadiene; 2-fluoro-1,3-butadiene and 2,3-dichloro-1,3-butadiene, and most preferably 2-chloro-1, 3-butadiene also called chloroprene or neoprene. This neoprene has the most superior properties for versitility in solvent resistance, particularly when the monomer content is maintained at or below about 10% by weight of the neoprene. In fact in general, the monomer content is preferably maintained at or below about 10% with any of the butadienes and particularly the halogenated butadienes to obtain their superior properties. For better printing plate products the halogen substituted butadiene resin is present in the composition in an amount of at least about 80% by weight. It is possible to use mixtures of the halogen substituted butadiene resins or for special applications to mix them with small quantities of other compatible polymers and particularly other natural-like rubber without greatly reducing their superiority.

Other natural-like rubbers having special application for the over-lamina composition are butadienes that are acrylonitrile resins. Examples are copolymers of butadiene and acrylonitrile with the acrylonitrile comprising 22-32% of the copolymer weight.

Still another natural-like rubber is natural rubber itself which shall for purposes of this application be understood to be included within the term "natural-like".

For better printing plate products the monomer preferably has at least two cross-linkable C—C double bonds and is a non-gaseous addition polymerizable ethylenically unsaturated compound, having a boiling point above 100° C. at atmospheric pressure, a molecular weight of about 100-1500 and being capable of forming high molecular weight addition polymers readily. Preferably the addition polymerization is by photoinitiated addition polymerization in the presence of an addition polymerization initiator. More preferably the monomer is an addition photopolymerizable polyethylenically unsaturated acrylic or methacrylic acid ester containing two or more acrylate or methacrylate groups per molecule or mixtures thereof. A few illustrative examples of such multifunctional acrylates are ethylene glycol diacrylate, ethylene glycol dimethacrylate, trimethylolpropane triacrylate, trimethylolpropane trimethacrylate, pentaerythritol tetra-acrylate or pentaerythritol-tetramethacrylate, hexanediol-1, 6-dimethacrylate, and diethylene-glycol-dimethacrylate.

Also useful in some special instances are monoacrylates such as n-butyl-acrylate, n-butyl-methacrylate, 2-ethylhexyl-acrylate, lauryl-acrylate, and 2-hydroxypropyl-acrylate. Small quantities of amides of (meth) acrylic acid such as N-methylol-methacrylamide-butyl-ether are also suitable. N-vinyl-compounds such as N-vinyl-pyrrolidone, vinyl-esters of aliphatic monocarboxylic acids such as vinyl-oleate, vinyl-ethers of diols such as butane-diol-1, 4-divinyl-ether and allyl-ether and allyl-ester are also suitable. Isocyanate free reaction products of organic polyisocyanates such as hexamethylene-diisocyanate, isophorone-diisocyanate or tolylene-diisocyanate with hydroxyl group containing (meth) acrylates such as glycol-monoacrylate, hydroxypropyl-methacrylate or 1,4-butane-diol-monoacrylate are also suitable as monomers provided they are adequately compatible with the resin. The same applies to the reaction products of di- or polyepoxides such as butane-diol-1, 4-diglycidyl-ether or bisphenol-A-diglycidyl-ether with (meth) acrylic acid. The characteristics of the photopolymerizable layers can be modified for the specific purpose by a suitable selection of monomers or mixtures thereof.

The thiols of the present invention are preferably polythiols that are either simple or complex organic compounds having a multiplicity of pendant or terminally positioned —SH functional groups per average molecule. The prefered polythiols must contain 2 or more —SH groups/molecule. They usually have a viscosity range of about 0 to about 20 million centipoises (cps) at 70° C., as measured by a Brookfield Viscometer. Included in the term "polythiols" as used herein are those materials which in the presence of reactive plasticizers such as diallyl phthalate fall within the viscosity range set out about at 70° C. Operable polythiols in the instant invention usually have molecular weights in the range of about 94 to about 20,000 or more, preferably about 100 to about 10,000.

The preferred polythiols operable in the instant invention, those thiols which give tack free surfaces, can be exemplified by the general formula: $R_8\text{-}(\text{---SH})_n$ where n is at least 2 and $R_8$ is a polyvalent organic moiety free from "reactive" carbon to carbon unsaturation. Thus, $R_8$ may contain cyclic groupings and minor amounts of hetero atoms such as N,S,P or O but, primarily, contains carbon-hydrogen, carbon-oxygen or silicone-oxygen containing chain linkages free of any "reactive" carbon to carbon unsaturation.

One class of polythiols operable in the instant invention to obtain essentially odorless cured polythioether coatings and relief images are esters of thiol containing acids of the general formula: $HS\text{-}R_9\text{---COOH}$ where $R_9$ is an organic moiety containing no "reactive" carbon to carbon unsaturation with polyhydroxy compounds of the general structure: $R_{10}\text{-}(\text{---OH})_n$ where $R_{10}$ is an organic moiety containing no "reactive" carbon to carbon unsaturation and n is 2 or greater. These components will react under suitable conditions to give a polythiol having the general structure:

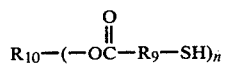

where $R_9$ and $R_{10}$ are organic moieties containing no "reactive" carbon to carbon unsaturation and n is 2 or greater.

Certain polythiols such as the aliphatic monomeric polythiols (ethane dithiol, hexamethylene dithiol, decamethylene dithiol, tolylene-2, 4-dithiol, etc.) and some polymeric polythiols such as the thiol terminated ethylcyclohexyl dimercaptan polymer, etc. and similar polythiols which are conveniently and ordinarily synthesized on a commercial basis, although having obnoxious odors, are operable in this invention. Examples of the polythiol compounds preferred for this invention because of their relatively low odor level and fast curing rate include esters of thioglycolic acid (HS—CH$_2$—COOH), α-mercaptopropionic acid (HS—CH(CH$_3$)—COOH and β-mercaptopropionic acid (HS—CH$_2$CH$_2$COOH) with polyhydroxy compounds such as glycols, triols, tetraols, pentaols, hexaols, etc. Specific examples of the preferred polythiols include ethylene glycol bis (thioclycolate), ethylene glycol bis (β-mercaptopropionate), trimethylolpropane tris (thioglycolate), pentaerythritol tetrakis (thioglycolate) and the most preferred pentaerythritol tetrakis (β-mercaptopropionate) and trimethylolpropane tris (β-mercaptopropionate), and mixtures thereof all of which are commercially available.

Monothiols such as β-mercaptopropionic acid can be used in some instances. Monothiols reduce tack significantly but do not eliminate it to the desired degree for general use.

The composition of the present invention is generally cured through the use of a curing agent which facilitates a controlled, rapid and determinable or predictable cure preformance. The curing agent generally acts as a free radical generating agent. Preferably the free radical generating agent includes initiation by radiation, either actinic light or high energy ionizing radiation. Most preferably the actinic radiation is UV radiation. The composition particularly lends itself to advantage in UV curing in forming relief images and especially for printing indicia production.

It is preferred that the UV light eminate from a point source or in the form of parallel rays but divergent beams are also operable as a source of actinic light. Practically any convenient source of high intensity UV light may be used. Such sources include carbon arcs, mercury arcs, fluorescent lamps with special ultraviolet light emitting phosphors, xenon arcs, sunlight, tungsten halide lamps, argon glow lamps, photographic flood lamps, laser and the like.

When actinic radiation is used for curing, a photoinitiator is normally added to the composition to increase the reaction rate. Initiators or catalysts which are operative in the present invention are those which are capable of initiating photopolymerization under the influence of actinic light. The preferred catalyst or initiators are substantially soluble in the photopolymerizable composition, and are effective in promoting rapid polymerization, by which the composition is cured. Many suitable photopolymerization initiators or catalysts are listed in U.S. Pat. No. 4,008,341 and contents of which are incorporated herein by reference. The preferred photoinitiators are the aldehyde and ketone carbonyl compounds having at least one aromatic nucleus attached directly to the

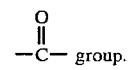

The more preferred photoinitiators are benzophenone and 2,2 dimethoxy 2-phenyl acetophenone.

The composition of the instant invention can also be cured by high energy ionizing irradiation or bombardment such as is described in the aforesaid U.S. Pat. No. 4,008,341.

The composition of the present invention may in proper instances include such additives as antioxidants, inhibitors, activators, fillers, pigments, dyes, antistatic agents, viscosity modifiers, plasticizers and the like. The aforesaid additives may be present in quantities up to 500 parts or more per 100 parts of radiation curable composition by weight and preferably 0.0005 to 300 parts on the same basis. The type and concentration of the additives must be selected with care so that the final composition remains suitable for its use and in preferred embodiments radiation curable under conditions of exposure.

The curing period may be retarded or accelerated from less than 1 minute to 30 days or more. Conventional curing inhibitors or retarders which may be used in order to stabilize the components or curable compositions so as to prevent premature onset of curing may include hydroquinone; p-tert-butyl catechol; 2,6-di-tert-butyl-p-methylphenol; phenothiazine; N-phenyl-2-naphthylamine; phosphorous acid; pyrogallol and the like. Conventional reaction promoters which give faster curing reaction rates and broaden the range of utilizable light wavelengths include trimethylphosphite, triethylphosphite, triphenylphosphite, rose bengal and acetone.

UNDER-LAMINA COMPOSITION DISCUSSION

The preferred under-lamina composition is comprised of a polymer containing composition chosen from the group consisting of compositions comprising radiation polymerizable material and radiation polymerized material. Preferably the under-lamina is at least significantly cured. The polymer of the under-lamina preferably has radiation polymerizable C—C unsaturation and is preferably a monoalkenyl aromatic-diene copolymer resin. The preferred under-lamina composition comprises (1) at least about 20% by weight of said composition of monoalkenyl aromatic-diene copolymer resin; and (2) at least about 2% by resin weight of at least one monomer substantially compatible with said resin and having at least one radiation cross-linkable C—C double bond. More preferably the resin is present in an amount of at least 40% by composition weight. Preferably the monoalkenyl aromatic-diene copolymer resin is the type having the general formula: A-B-A wherein the end blocks A are monoalkenyl aromatic polymer blocks which may be the same or different and which have an average molecular weight of from 2,000 to 100,000 and a glass transition temperature above 25° C., the total block A content being 10–50% by weight of the copolymer, and B is an elastomeric diene polymer block having an average molecular weight of from 25,000 to 1,000,000 and a glass transition temperature below 10° C.

These end blocks (A) are typically derived from monoalkenyl aromatic compounds having the general formula:

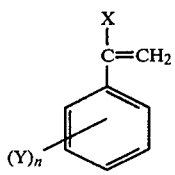

wherein X represents hydrogen or an alkyl radical containing 1 or 2 carbon atoms such as a methyl or ethyl radical; Y represents hydrogen or an alkyl radical containing from 1 to 4 carbon atoms such as a methyl, ethyl, n-propyl, isopropyl, n-butyl, sec-butyl or a tert-butyl radical; and n represents an integer from 1 to 5. Examples of the alkenyl aromatic compounds which are within the scope of formula A are: styrene, alpha-methyl styrene, tert-butyl styrene, vinyl toluene, ortho- and para-methyl styrenes, ortho- and para-methyl-alpha-methyl styrenes, and ortho- and para-ethyl styrenes.

The elastomeric block (B) is preferably a diene polymer block derived from a conjugated diene hydrocarbon compound having the general formula:

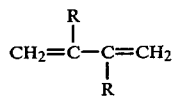

wherein each R individually represents hydrogen or an alkyl radical containing 1 or 2 carbon atoms such as a methyl or ethyl radical. Examples of the conjugated diene hydrocarbon compounds which are within the scope of block B are 1,3-butadiene and 2-methyl-1,3-butadiene.

Typical examples of the just described monoalkenyl aromatic-diene block copolymers, useful in the present invention, are described in U.S. Pat. No. 3,265,765, the contents of which are incorporated herein by reference.

An alternate but in general less desirable monoalkenyl aromatic-diene copolymer resin—for use in the present invention—is of the type having the general formula:

A—B where blocks A and B are the same as those designated by the same letters in the A-B-A block copolymer. The A—B type copolymer resin can have a sharp or a blurred, i.e. a "flowing" transition between the two block segments of the copolymer formed solely from diene-hydrocarbons or styrene-monomers. The two-block-copolymers contain 5 to 70 and preferably 10 to 40% by weight in units of the last mentioned monomer of the styrene type, and consequently 30 to 95 and preferably 60 to 90% by weight of polymerized-end units of diene-hydrocarbon. The production of the two-block copolymers of the above mentioned type is known per se and can in particular take place according to the procedure described in U.S. Pat. No. 3,149,182. Reference is also made to the articles by I. Kuntz, J. Polymer Sci. 54 (1961), 569–586 and Y. U. Spirin etal, J. Polymer Sci. 58 (1962) 1181–1189. The copolymers can be produced continuously or discontinuously. In the production of copolymers with sharply separated block segments through stepwise copolymerization, it is advantageous to start with the polymerization of the monomer which quantitatively preponderates. Advantageously, the two-block copolymers are produced by solution-polymerization whereby suitable solvents are in particular hydrocarbons or mixtures thereof as well as polar solvents such as tetrahydrofurane. The type of solvent influences the fine structure of the two-block copolymer like the configuration of the diene-polymer segments. Preferably hydrocarbons are used as solvents. It is particularly advantageous to use the solutions of the block copolymers produced by solution-polymerization either directly or in concentrated state, after adding the other coating constituents for producing the photo-crosslinkable layer by casting.

Suitable two-block copolymers of the indicated type, measured as 0.5% by weight solutions in toluene, have viscosity numbers of approximately 60 to 350 ml/g and in particular 90 to 250 ml/g, corresponding to a molecular weight range $\overline{M}_\nu$ of approximately 75,000 to 200,000.

In its more preferred form the under-lamina is cured by radiation and more preferably actinic radiation and contains a photoinitiator in the same preferred proportions and of the same preferred description as given in the over-lamina discussion. In one preferred form the under-lamina composition may also include a thiol of the same preferred description and quantities as given in the over-lamina discussion. The discussion respecting preferred monomers with regard to the over-lamina composition is apropos to the under-lamina polymer compositions and will not be repeated. However, in the under-lamina, while the monomer is present in the preferred composition, it is less important to good performance than in the over-lamina. In its more expedient and preferred forms the under-lamina contains 5–30% by polymer weight of the monomer, preferably at least 10%. In other operating characteristics, i.e. radiation and the like, the description previously given for the over-lamina composition as preferred is applicable to the under-lamina and therefor to avoid prolixity will not be repeated because those skilled in the art can readily understand the applicability.

Another under-lamina composition group, that while generally less preferred, gives special preferred properties in the right application is comprised of the textiles that are resilient but non-rubbers. In general these textiles are built up in layers or plys to the desired thickness. The plys are generally secured together with adhesives. The textile cloth can be impregnated with a natural-like rubber so long as the characteristics of the composite are those of the textile fabric fibers rather than of the natural-like rubber particularly with regard to creep.

GENERAL DISCUSSION

The method of mixing the components of the compositions and assemblying them into the laminate structures of the present invention is not critical, and does not constitute part of the invention. Solutions and dispersions of the compositions can be made with such solvents as aromatic hydrocarbons, e.g. benzene, toluene and xylene; chlorinated hydrocarbons. e.g. chloroform, carbon tetrachloride, trichloroethylene and chlorotoluene; ketones, e.g. methyl ethyl ketone, diethyl ketone and methyl isobutyl ketone and blends of such solvents. On the other hand, solid mixes may be prepared by mixing the components on a mill or in an internal mixer such as a Banbury. The resultant polymerizable compositions may be in the form of a liquid solution, liquid dispersion, or as a solid mix. The liquid solution or liquid dispersion may be cast directly as a lamina or ply of a lamina, or first cast upon a suitable wheel or belt, stripped, and then affixed in position in the laminate. The solid mix may be extruded or calendered directly in position in building the laminate or as a self-supporting sheet and then affixed in position.

In the preferred form the relief producing structure is built upon a substrate, preferably a flexible backing which may be aluminum, polyester or paper and is in its most prefered form about 2 to about 6 mils thick polyester preferably mylar. The under-lamina is preferably built up on the substrate to a thickness of about 30 to about 225 mils. Preferably this is done by applying layers, doctored on coats or thin plys, layed down about 0.5 to about 10 mils thick, more preferably about 1 to about 5 mils thick. These are preferably laid down from solution and then exposed to radiation sequentially after lay down to partially cure them. As subsequent plys are laid down the radiation exposure in the preferred form of the invention further cures the under plys. When the desired thickness of under-lamina has been laid down then the over-lamina is preferably applied in the same about 0.5 to about 10 mils thick plys, more preferably about 1 to about 5 mils ply thicknesses until the desired over-lamina thickness is achieved. The overlamina preferably consists of at least 2 juxtaposed layers in fact of a multiplicity of layers. However, both the over-lamina and the under-lamina could in some instances advantageously be only a single layer. The preferred over-lamina thickness is about 1 to about 50 mils, more preferably about 30–40 mils. Preferably the first 2 or 3 plys of the over-lamina are also exposed at the time of laydown, the remaining plys being uncured. Thus the preferred relief producing structure has an over-lamina that is at least substantially uncured and an under-lamina that is at least significantly cured. The under-lamina consists of at least 2 juxtaposed layers, in fact a multiplicity of layers, each of which is less highly cured than the juxtaposed under-layer. Creep is seldom a significant problem in the laminate when the over-lamina is not more than 50 mils thick. Creep becomes an increasing problem in the preferred chloroprene over-lamina as the thickness of the over-lamina increases from 50 mils. When the over-lamina exceeds 85 mils in thickness the creep problem is sufficiently severe to, in many cases, render the laminate unsuitable for use in the conventional commercial printing plate market.

Such a progressively cured structure could be produced in other manners such as by exposure from the bottom of the lamina. Further more it is possible to completely cure the under-lamina and provide a completely uncured over-lamina. The under-lamina could, of course, also have an adhesive layer or the like securing it to the over-lamina. These would however not be the preferred forms of the invention.

A convenient method of forming a printing plate, which is the preferred form of the invention, is to place an image-bearing, line or half-tone, stencil or positive or negative transparency parallel to the surface of the photocurable composition of the over-lamina. The image-bearing transparency and the surface of the photocurable composition should preferably be in contact. To make possible easy removal of the image-bearing transparency from the printing plate after photopolymerization, it is desirable to coat the printing plate with a "parting" layer or slip coat. Suitable coatings include the conventional acrylic latex slip coats, silicon greases, etc. The photocurable layer is exposed through the transparency to a source of actinic light until the photocurable layer is cured to an insoluble stage in the exposed areas.

Development can be carried out by conventional means. In general after exposure of the plates, the exposed areas are removed by suitable means such as a suitable solvent liquid which has good solvent action on the unexposed radiation curable composition and relatively little action on the cured, photopolymerized image or upon the under-lamina, substrate, antihalation coating, or any anchor layer, in the period required to remove the non-polymerized portions. Suitable organic solevents for most of the unexposed radiation curable compositions include aliphatic hydrocarbons such as hexane, octane, mineral oils, naphthas, etc. aromatic solvents such as toluene, xylene, etc., halogenated organic solvents such as methylene chloride, trichloroethane, Freon$^D$, etc., and blends of such solvents. The best solvent to use depends on the exact composition of the radiation curable composition. In the development step where the relief is formed the solvent may be applied in any convenient manner, as by pouring, immersion, or spray. Brushing or agitation aid in the removal of the non-polymerized portion of the composition. The use of ultrasonic washing techniques is a convientient means of removing the non-polymerized areas of the relief printing plate.

In making printing plates it is important that the exposure be sufficient to harden the photocurable composition in the exposed image areas with causing significant curing in the non-image areas. Aside from exposure time and light intensity, the extent of the exposure is dependent on the thickness of the photocurable layer, the curing temperature, the monomer having the photo-cross-linkage C—C double bond and polythiol employed, the photoinitiator, diluent, the presence of light absorbing pigments or dyes in the photocurable composition and the character of the image to be reproduced. In general, the thicker the layer to be cured, the longer the exposure time. Curing generally starts at the surface of the photocurable layer closest to the light source and proceeds downward to the support. With insufficient exposure, the layer may have a hard cure at the surface but, through lack of a clear-through cure, the relief will be removed when the unexposed area is removed. Inasmuch as the curing rate usually increases at higher temperature, less exposure is required there than at room temperature. Thus, ultraviolet light sources that emit heat are more efficient than cold ultraviolet light sources. However, care must be exercised that too high a temperature is not attained during the photocure, as this leads, in some cases, to thermal expansion of the photocurable composition which results in image distortion. Hence, it is preferred that the photocuring be carried out at a temperature in the range about 20° to about 70° C. Due to the number of variables which affect exposure time, optimum results are best determined emperically e.g. stepped exposures with characterization after each exposure.

It will be obvious to those skilled in the art that the structure of the present invention can have uses other than in the preparation of printing plates. Obviously any use requiring a relief surface of the type produced will benefit from use of this invention. However, the production of flexographic printing plates uses the essence of the special properties provided by this invention.

As used herein the term "cure" means the relative curing of the radiation curable composition. This is contrasted with the description "removing the unexposed radiation curable composition" which means removing the material that is relatively uncured. In context it is believed this is clear and that it will be understood that the term "cure" or "cured" does not means that no further curing could take place and that the term unexposed does not mean that no radiation reached that portion of the composition. Primarily the terms refer to the state enableing the separation of the "cured" from the unexposed and thus uncured. The term "tack-free" means tack-free to touch with the human hand and therefore freedom from being sticky in general. The term "tacky" means tacky to touch with the human hand and therefore in general sticky and tending to have materials that contact such a surface adhere to the surface.

By "natural-like rubber" it is meant both natural and synthetic rubbers which exhibit creep as a result of what is understood to be a manifestation of a stress relaxation in the cast or formed sheet of polymer.

By "creep" it is meant the phenomenon that exhibits itself in a sheet of polymeric material that develops significant thickness variations upon standing. To determine creep a compound being tested may be formed into 10 replica sheets 110 mils thick by 2 feet on a side (4 square feet). Immediately after being formed (and before curing) 5 of the sheets are placed in dark storage at 70° F. The other 5 sheets are cut into strips, 1 inch wide by 2 feet long, and measured at 10 evenly spaced intervals beginning at an outer end and continuing at even intervals along the 2 foot length. After 1 month the 5 sheets in dark storage are removed, cut into strips and measured as previously described for the unstored sheets. An observable thickness variation is readily determinable when creep is present. In general the outer regions of the sheets beginning at the edges will have drawn inwardly and be thickened. This is not to be confused with any curling characterization.

The standard for setting the test can be checked by forming 10 single ply sheets 110 mils thick by 4 square feet (2 feet on an edge) from the over-lamina composition of the Example of this application which will exhibit creep under the above described conditions. Ten single ply sheets 110 mils thick by 4 square feet (2 feet on an edge) are then formed from the under-lamina composition of the Example of this application which will not exhibit creep under the above described conditions.

Even though a printing plate is used prior to its exhibiting observable creep it may have latent creep which will manifest itself after the etching and drying by visually observable distortion of the definition of fine characters such as small dots, fine lines and small type even though no apparent thickness variation is present.

The present invention also eliminates a cupping problem that is present when the natural-like rubber and particularly the very much preferred chloroprene or neoprene is used for the printing surface. Cupping is an undesriable condition that sometimes occurs on large or large solid printing areas of relief printing plates whereby the edge of the individual printing area is raised above the rest of the printing surface. When the plate is printed the raised edges print darker and the rest of the surface prints lights, or not at all if the condition is severe enough. Shrinkage of the plate material during exposure is thought to be one of the causes of cupping. A plate made completely of neoprene generally exhibits cupping and often severe cupping. A plate made completely of the block copolymer described as the preferred under-lamina composition does not exhibit cupping. Minimizing the amount of neoprene used to that of an over-lamina and providing the under-lamina of this invention and particularly the preferred under-lamina comprised of the block copolymer results in a plate that does not cup. It is to be understood that throughout this application a support or carrier substrate may be present and yet the plate is not considered to be a laminate because such plates are of the conventional plate construction common in the industry today. Such substrates may be thin aluminum sheets, polyester sheets, etc.

Another problem encountered in many printing plates of the prior art is curling. Curling is an undesirable condition whereby two opposite edges of a printing plate do not lie flat when placed on a table or other horizontal surface. Curling makes the mounting of the plate on a press cylinder and the handling of the plate more difficult. In its most severe consition, it may even cause the plate to pull away from adhesives used to mount them on smaller diameter printing press cylinders. The block copolymer under-lamina exhibits this condition by itself and the neoprene over-lamina does not. When combined together in accordance with the present invention the resulting laminate does not curl.

This invention is further illustrated by the following Example.

EXAMPLE

An under-lamina composition consisting of the following mixture was prepared:

(a) 100 parts of styrene-isoprene-styrene (SIS) block copolymer.

(b) 10 parts of trimethylolpropane trimethacrylate.

(c) 2 parts pentaerythritol tetrakis($\beta$-mercaptopropionate).

(d) 1 part 2,2 dimethoxy 2-phenyl acetophenone.

(e) 2 parts hindered phenol (Ionol ®) (a curing inhibitor)

The particular SIS copolymer was Kraton ® 1107, manufactured by the Shell Chemical Company, and was composed of approximately 14% by weight polystyrene equally distributed between the two end blocks, the remainder being polyisoprene. The composition was prepared by dissolving the composition in toluene in a stirred resin kettle. Ingredient (a) was charged in first and dissolved followed by (b), (d) and (e) in rapid succession and then (c) after the others has dissolved.

The solution was then doctor coated to a thickness of approximately 70 mils on a 4 mils thick polyester (Mylar) backing sheet by building up layers 1 or 2 mils thick using a doctor blade and exposing each layer to actinic light for about 2–4 second before application of the next layer. The actinic light was a UV light source emitting actinic radiation of a wavelength of 3600° A.

The over-lamina composition was prepared by dissolving in a resin kettle containing 362 parts of toluene, one hundred sixty-three (163) parts of the plastic polychloroprene (155 g WRT+8 g of AD-40, both WRT and AD-40 are products of DuPont; the WRT being softer and less crystaline than the AD-40). Then 15.1 parts of trimethylolpropane trimethacrylate, 0.8 parts of 2,6 dit-butyl cresol, 1.6 parts of 2,2 dimethoxy 2-phenyl acetophenone and 3.3 parts of pentaerythritol tetrakis ($\beta$-mercaptopropionate) were added to the resin kettle followed by a thorough mixing of the solution before its application.

The over-lamina was doctored on to a thickness of about 35 mils in the same manner as described for the under-lamina except only about the first 5 mils were exposed to actinic light at the time of application.

The resulting plate was placed in a vacuum frame, and the polymer surface brought into contact with a line negative and subjected to a UV light source emitting actinic radiation of a wavelength of 3600° A for several minutes. After exposure, the negative was stripped from the plate and the unexposed polymer was removed in an etch bath of trichloroethane.

A relief image of about 30 mils corresponding to the clear areas of the negative was obtained. The photopolymer was extremely resilient, free from brittleness and bendable such that no adverse effect was observed when bending through 180°. The plate was free of tack to hand touch. The plate was placed on a printing cylinder on a flexographic press and satisfactory prints of the original image were obtained. The plate was free of tack to the hand touch.

The composition of the under-lamina of Example 1 had the following properties:

$$\frac{100 \text{ parts } (SIS)}{115 \text{ parts } - \text{ total all ingredients}} \times 100 = 87\%$$ by weight of the composition is mono-alkenyl aromatic-diene copolymer resin.

$$\frac{10 \text{ parts trimethylolpropane trimethacrylate}}{100 \text{ parts } (SIS)} \times 100 = 10\%$$ by resin weight of monomer substantially compatible with the resin and having at least one cross linkable C—C double bond.

$$\frac{2 \text{ parts pentaerythritol tetrakis } (\beta\text{-mercaptopropionate})}{100 \text{ parts } (SIS)} \times 100 = 2\%$$ by resin weight of polythiol.

$$\frac{1 \text{ parts 2,2 dimethoxy 2-phenyl acetophenone}}{100 \text{ parts } (SIS)} \times 100 = 1\%$$ by resin weight of photoinitiator.

The composition of the over-lamina of Example I had the following properties:

$$\frac{16.3 \text{ grams polychloroprene}}{183.8 \text{ grams total all ingredients}} \times 100 = 88.7\%$$ by weight of the composition is halogen substituted butadiene synthetic rubber.

$$\frac{15.1 \text{ grams trimethylolpropane trimethacrylate}}{163 \text{ grams polychloreprene}} \times 100 = 9.3\%$$ by butadiene weight of monomer substantially compatible with the butadiene and having at least one photo-cross linkable C—C unsaturated bond.

$$\frac{3.3 \text{ grams pentaerythritol tetrakis } (\beta\text{-mercaptopropionate})}{163 \text{ grams polychloroprene}} \times 100 = 2\%$$ by butadiene weight of polythiol.

$$\frac{1.6 \text{ grams 2,2 dimethoxy 2-phenyl acetophenone}}{163 \text{ grams polychloroprene}} \times 100 = .9\%$$ by butadiene weight of photoinitiator.

While in accordance with the patent statues, we have described what at present is considered to be the preferred embodiment of our invention it will be obvious to those skilled in the art that numerous changes and modifications may be made therein without departing from the invention and it is therefore aimed in the appended claims to cover all such equivalent variations as fall within the true spirit and scope of the invention.

We claim:

1. The method of forming a printing plate which comprises exposing to actinic radiation projected through an image-bearing transparency selected portions of a radiation curable structure comprising an over-lamina not more than 85 mils thick of an actinic radiation curable C—C unsaturated natural-like rubber composition comprised of C—C unsaturated polymeric resin characterized by relief differentiation in response to patterned radiation exposure and a resilient creep stabilizing under-lamina composition comprising (1) at least about 20% by weight of said composition of monoalkenyl aromaticdiene copolymer resin, and (2) at least about 2% by resin weight of at least one monomer substantially compatible with said resin and having at least one radiation crosslinkable C—C double bond, for a time sufficient to cure the radiation curable composition in the exposed portions and thereafter removing the unexposed radiation curable composition.

2. The method of claim 1 wherein said under-lamina comprises at least two juxtaposed layers, each of said layers being less cured than the juxtaposed under-layer.

3. The method of claim 1 wherein said under-lamina has a thickness of about 30 to about 225 mils and wherein said under-lamina overlies a flexible backing substrate of a composition different from said under-lamina, said under-lamina being more resistant to distortion than said over-lamina during printing operations and said backing substrate being more resistant to distortion than said under-lamina during printing operations.

4. The method of claim 3 wherein said under-lamina composition includes about 0.01 to about 10% by weight of photoinitiator.

5. The method of claim 1 wherein said under-lamina composition comprises at least 40% by composition weight of a block copolymer resin having the general formula A-B-A with blocks A being monoalkenyl aromatic blocks which may be the same or different and which have an average molecular weight of from 2,000 to 100,000 and a glass transition temperature above 25° C. and having the general formula:

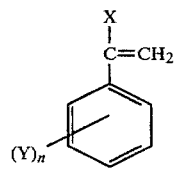

wherein X represents hydrogen or an alkyl radical containing 1 or 2 carbon atoms, Y represents hydrogen or an alkyl radical containing from 1 to 4 carbon atoms, and n represents an integer from 1 to 5 and with block B being derived from conjugated diene hydrocarbon having the general formula:

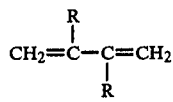

wherein each R individually represents hydrogen or an alkyl radical containing 1 or 2 carbon atoms.

6. The method of claim 5 wherein said monomer in said under-lamina is an addition polymerizable ethylenically unsaturated acrylic or methacrylic acid ester containing two or more acrylate or methacrylate groups per molecule or mixture thereof and is present in an amount of at least 10% by resin weight, and a photoinitiator chosen from the group consisting of benzophenone and 2,2-dimethoxy 2-phenyl acetophenone and mixtures thereof present in an amount of 0.2 to 5%.

7. The method of claim 1 wherein said over-lamina is not more than about 50 mils thick and its radiation curable C—C unsaturated polymeric resin comprises a halogen substituted butadiene resin, which is present in said natural-like rubber composition in an amount of about 10 to about 97% by composition weight said natural-like rubber composition further comprising at least about 1% but not more than about 10% by resin weight of at least one monomer having at least one radiation cross-linkable C—C unsaturated bond and about 0.01 to about 10% by weight of photoinitiator.

8. The method of claim 1 wherein said over-lamina composition comprises at least about 80% by weight 2-chloro-1, 3-butadiene, about 5% to about 10% by butadiene weight of a monomer that is an addition photopolymerizable polyethylenically unsaturated acrylic or methacrylic acid ester containing two or more acrylate or methacrylate groups per molecule or mixtures thereof.

9. The method of claim 1 wherein said C—C unsaturated polymeric resin in said over-lamina is present in said natural-like rubber composition in an amount of about 10 to about 97% by composition weight and said natural-like rubber composition includes at least about 1% by resin weight of at least one monomer having at least one radiation cross-linkable C—C unsaturated bond.

10. The method of claim 1 wherein said C—C unsaturated polymeric resin in said over-lamina composition comprises butadiene homopolymer or copolymer resin.

11. The method of claim 10 wherein said resin of said butadiene is a halogen substituted butadiene resin.

12. The method of claim 11 wherein said halogen substituted butadiene resin is chosen from the group consisting of 2-chloro-1, 3-butadiene; 2-fluoro-1, 3-butadiene and 2,3-dichloro-1, 3-butadiene and mixtures thereof and is present in an amount of at least about 80% by weight of said natural-like rubber composition, which composition includes a monomer substantially compatible with said butadiene, having at least one photocross-linkable C—C unsaturated bond and present in an amount of about 0.01 to about 10% by butadiene resin weight.

13. The method of claim 1 wherein said printing plate is substantially free of cupping and curling.

14. The method of claim 7 wherein said under-lamina comprises at least three juxtaposed layers, each layer being less cured than the juxtaposed under-layer and said over-lamina comprises at least three juxtaposed layers with at least the layer closest to said under-lamina being more highly cured than said over-layers of the over-lamina.

* * * * *